United States Patent [19]

Sendelweck

[11] Patent Number: 5,045,733
[45] Date of Patent: Sep. 3, 1991

[54] SWITCHING APPARATUS WITH CASCADED SWITCH SECTIONS

[75] Inventor: Gene K. Sendelweck, Indianapolis, Ind.

[73] Assignee: Thomson Consumer Electronics, Inc., Indianapolis, Ind.

[21] Appl. No.: 441,901

[22] Filed: Nov. 28, 1989

[51] Int. Cl.$^5$ .......................... H03K 5/08; H03K 3/06
[52] U.S. Cl. .................................... 307/566; 307/318; 307/256; 333/81 R
[58] Field of Search ............... 307/540, 547, 549, 551, 307/559, 561, 542, 544, 296.4, 362, 285, 260, 566, 318, 571, 576, 579, 239, 264; 361/90, 91, 111; 330/285; 333/81 R, 262, 103, 104

[56] References Cited

U.S. PATENT DOCUMENTS

| | | | |
|---|---|---|---|
| 3,243,604 | 6/1963 | Johnson | 307/547 |
| 3,515,995 | 6/1970 | Belcourt et al. | 307/260 |
| 3,529,179 | 9/1970 | Orrell | 307/566 |
| 3,582,680 | 6/1971 | Slavin | 307/542 |
| 3,603,818 | 9/1971 | White | 307/260 |
| 3,800,299 | 2/1974 | Backwinkel et al. | 333/81 R |
| 3,859,609 | 1/1975 | Couvillon et al. | 307/542 |
| 4,020,423 | 4/1977 | Guyot et al. | 307/362 |
| 4,243,947 | 1/1987 | Glennon | 330/285 |
| 4,405,903 | 9/1983 | Blackburn | 307/559 |
| 4,494,076 | 1/1985 | Rinderle | 333/81 R |
| 4,521,810 | 6/1985 | Nigborowicz et al. | 358/181 |
| 4,638,181 | 1/1987 | Deiss | 307/243 |
| 4,668,875 | 5/1987 | Miyazaki et al. | 307/318 |
| 4,689,498 | 8/1987 | Rinderle | 333/81 R |
| 4,736,271 | 4/1988 | Mack et al. | 361/91 |
| 4,841,177 | 6/1989 | Sugiyama | 307/542 |

FOREIGN PATENT DOCUMENTS 0021234 2/1979 Japan .................................. 307/542

Primary Examiner—Stanley D. Miller
Assistant Examiner—Toan Tran
Attorney, Agent, or Firm—Joseph S. Tripoli; Peter M. Emanuel; Richard G. Coalter

[57] ABSTRACT

Switches are cascaded for improved off-state attenuation. The first switch of the cascade comprises an L-type attenuator with series branch including a resistor and a shunt branch including a Zener diode. A bias network coupled to the attenuator and to the second switch of the cascade connection controls the diode bias for operation at a specific forward conduction when the second switch is open and for operation at a specific reverse bias condition when the second switch is closed for causing the attenuator to provide the plural functions of (1) enhancing the switch off-state attenuation, (2) providing over-voltage and overcurrent protection for input transients of either polarity and (3) providing a predetermined output DC level when the second switch is on for establishing the DC bias of a subsequent circuit, such as an amplifier, the DC bias so supplied being in a tracking relationship with DC power supplied to the subsequent circuit.

15 Claims, 3 Drawing Sheets

SWITCHING APPARATUS WITH CASCADED SWITCH SECTIONS

FIELD OF THE INVENTION

This invention relates to signal switching apparatus and particularly to apparatus of the kind employing cascaded switch sections for enhancing the off-state attenuation of high frequency signal components being switched.

BACKGROUND OF THE INVENTION

The attenuation provided by a switch when the switch is turned off ("off-state" attenuation) is an important figure of merit for a switching circuit and particularly so in applications where the signal to be switched contains significant amounts of high frequency energy. As an example, when switching between a number of video input signals for television apparatus (e.g., recorders, receivers, monitors, effects generators, etc.) it is important that the video input signal that is not selected be attenuated below a minimum level to avoid interference with the selected video input signal. Generally speaking, it would be desirable to attenuate the unselected video signal by at least 60 dB and preferably more. Such levels of attenuation at video frequencies are not easily achieved with conventional integrated circuit switches due, for example, to the presence of parasitic capacitances. For this reason various methods have been proposed for improving the off-state attenuation of integrated circuit switches. One such technique, described in the following two examples, is to connect switches in cascade so that their off-state attenuations are additive.

A first example of switch cascading for improved off-state attenuation is described by Nigborowicz et al. in U.S. Pat. No. 4,521,810 entitled VIDEO SOURCE SELECTOR which issued June 4, 1985. In a specific embodiment of this switching circuit, an emitter follower is connected in cascade with an integrated circuit switch of the CMOS type and a clamping transistor is connected to the base of the emitter follower transistor and controlled to disable the emitter follower when the CMOS switch is opened. By this means the video signal being switched is attenuated both by the disabled emitter follower circuit and by the CMOS switch when the switch is turned off.

A second example of cascaded switching circuits is described by Deiss in U.S. Pat. No. 4,638,181 entitled SIGNAL SOURCE SELECTOR which issued Jan. 20, 1987. In a specific embodiment disclosed in the Deiss patent a diode switch is connected in series with a CMOS integrated circuit switch. The circuit includes a bias circuit that sends turn-on current through the CMOS switch to the diode switch when the CMOS switch is closed. Another bias circuit applies reverse bias to the diode switch when the CMOS switch is opened. For maximum off-state attenuation Deiss recomends the use of a diode of the p-i-n type as such diodes exhibit a very low junction capacitance and thus minimize parasitic coupling when the diode is off.

SUMMARY OF THE INVENTION

The foregoing two examples of cascased video switches provide excellent attenuation performance. However, neither example is specifically addressed to problems relating to over-voltage protection. In certain applications, such as video switching, one may expect transients to occur when connecting video cables to input signal sources and when turning the sources on and off. Although it is customary practice for manufacturers of integrated circuit analog switches to include some form of input protection directly on the integrated circuit, the protection provided may not always be sufficient.

The present invention resides in part in recognizing the need for a switching circuit: (1) which provides a high off-state attenuation; (2) which includes provisions for over-voltage protection for signal transients of either polarity; and (3) which additionally has the capability of providing a predetermined DC component of output voltage when the switch is closed.

In switching apparatus according to the present invention, first and second switches are connected in cascade between a signal input terminal and a signal output terminal. The first switch comprises an L-type attenuator with a series branch including an impedance and a shunt branch including a break-down device. A bias network, coupled to the attenuator controls the bias of the break-down device for operation at a predetermined current conduction level when the second switch is open and controls the bias for the break-down device for operation at a predetermined bias voltage level when the second switch is closed.

In a preferred embodiment of the invention, the first and second switches are connected in the order named between the signal input and output terminals. In another embodiment, the order of the switches is reversed.

BRIEF DESCRIPTION OF THE DRAWING

The foregoing and further features of the invention are illustrated in the accompanying drawing wherein like elements are denoted by like reference designators and in which.

DETAILED DESCRIPTION

Figure 1:
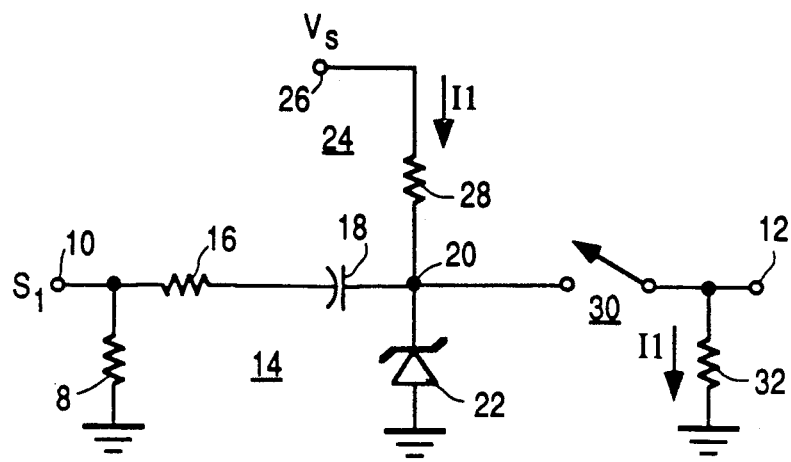
FIG. 1 is a circuit diagram, partially in block form, of switching apparatus embodying the invention.

The switching apparatus of FIG. 1 is of the cascade type, that is, it comprises two switches connected in series between a signal input terminal 10 and a signal output terminal 12. As previously explained, cascading switches provides improved off-state attenuation since the attenuations of the switches are additive.

In accordance with an aspect of the invention, the first switch of the cascade connection comprises an "L" type attenuator 14 having a series branch 15 (outlined in phantom) and a shunt branch 17 (outlined in phantom). The series branch comprises a resistor 16 and a capacitor 18 connected in series between the signal input terminal 10 and the output node 20 of the attenuator. The shunt branch comprises a breakdown semiconductor device illustrated here as being a Zener diode 22 connected at the anode thereof to a point of reference potential (ground) and at the cathode thereof to the attenuator output circuit node 20. Turn-on bias current for Zener diode 22 is provided by a current source 24 comprising a supply voltage input terminal 26 and a resistor 28 coupled between terminal 26 and the output node 20 of attenuator 14. The second switch 30 of the cascade connection is coupled between the attenuator output node 20 and the signal output terminal 12 of the switching apparatus. Turn-off bias for Zener diode 22 is provided by a load resistor 32 coupled between signal output terminal 12 and the source of reference potential (ground). An optional input termination load resistor 8 may be coupled between input terminal 10 and ground.

As a brief overview of certain features of the switching apparatus of FIG. 1, the attenuator 14 provides the dual functions of (1) enhancing the over-all off-state attenuation and (2) providing over voltage and over current protection for input signal transients of either polarity. As discussed in detail below the overcurrent protection or current limiting feature is provided by resistor 16 in the series branch of the attenuator 14. This resistor limits the input signal current for either polarity of the input signal transient. The overvoltage protection is provided by Zener diode 22 in the shunt branch. This breakdown device limits the maximum positive attenuator output voltage to the Zener breakdown value and limits the maximum negative attenuator output voltage to the forward-biased voltage drop of the Zener diode. It will be appreciated that Zener diode 22 also provides a current limiting function in that it shunts excessive input currents to ground and by limiting the voltage to subsequent circuits therefore also effectively limits the current to such circuits also.

Briefly stated, control of attenuator 14 is provided by switch 30 as follows. When switch 30 is open, all of the current of source 24 flows through diode 22 thereby turning the diode on and attenuating the input signal. The precise attenuation thus provided is discussed in detail below. When switch 30 is closed, all of the current from source 24 is diverted through switch 30 and load resistor 32 to ground thereby turning diode 22 off. This reduces the attenuation to a minimum value providing a predetermined insertion loss and also develops a predetermined DC output voltage at terminal 12 for establishing a quiescent DC bias for subsequent load circuitry (e.g., an amplifier, not shown) which may be connected to output terminal 12.

Figure 5:
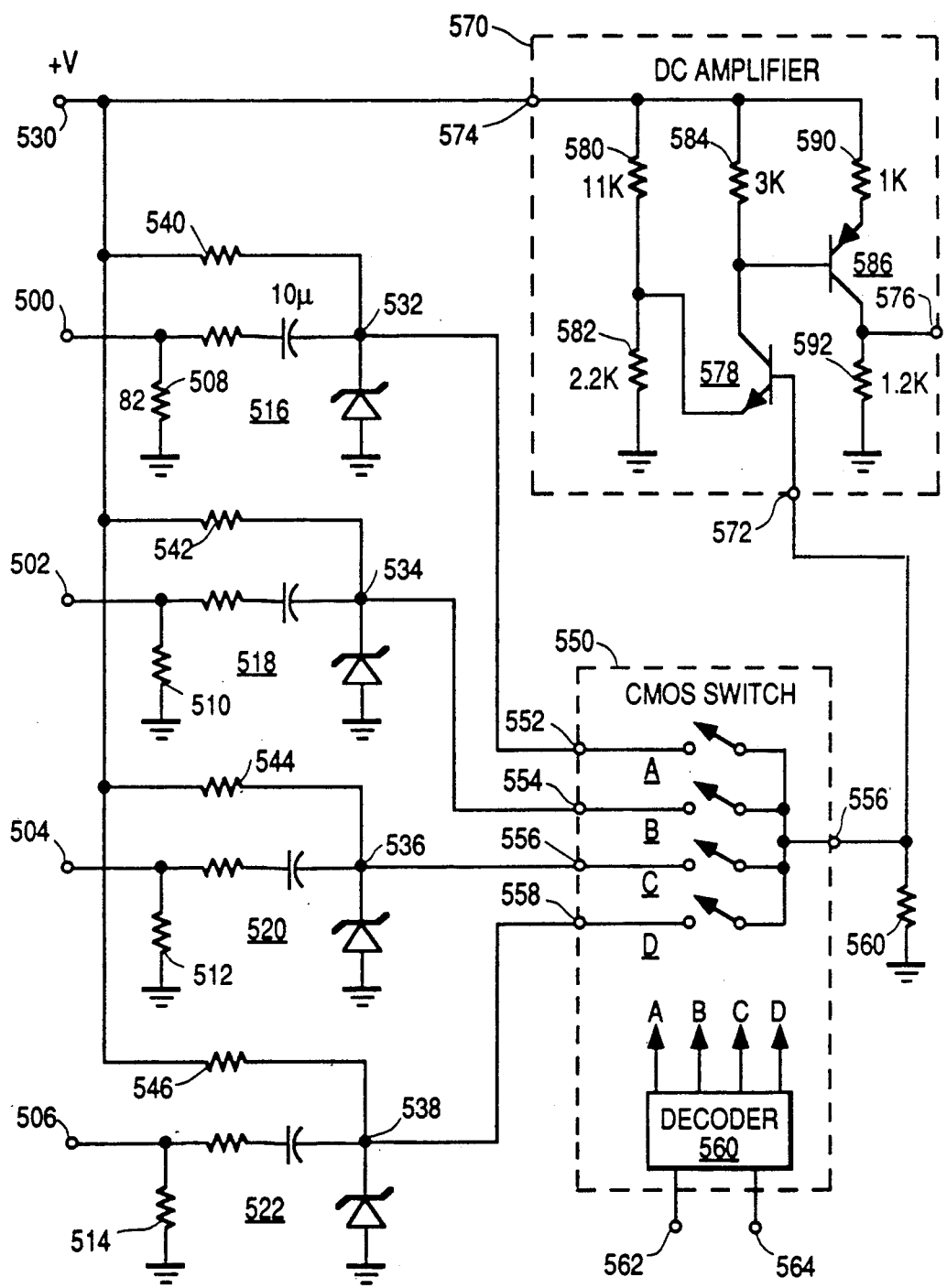
FIG. 5 is a detailed circuit diagram, partially in block form, illustrating certain modifications of the apparatus of FIG. 1.

In the specific example of FIG. 1, switch 30 of the cascade connection is illustrated as being a single pole switch having open and closed conditions. This switch may be of the mechanical type in which case the overvoltage protection features of the invention benefit what ever utilization device (not shown) may be connected to the signal output terminal 12 of the switching apparatus. In a preferred application of the principles of the invention the switch 30 would be an electronic switch which may have plural poles and may be constructed in integrated circuit form. FIG. 5, discussed later, gives an example of use of a four-position integrated circuit switch as switch 30. In that example the benefits of over-voltage protection provided by the present invention augment or enhance the internal overvoltage protection that is customarily provided "on-chip" by the integrated circuit manufacturer.

The detailed operation of the switching apparatus of FIG. 1 will now be discussed. When switch 30 is in the OPEN condition (as shown) current source 24 supplies a bias current I1 to Zener diode 22 which places diode 22 in a low impedance conductive state. Capacitor 18 provides the function of blocking the current I1 in the series branch of attenuator 14. This feature of the invention ensures that all of the Zener diode turn-on current flows through the Zener diode 22 and none of it is diverted to the signal input terminal 10. Advantageously, this feature allows one to precisely determine the operating bias point for Zener diode 22 without regard to the impedance of the signal source coupled to input terminal 10.

Figure 2:
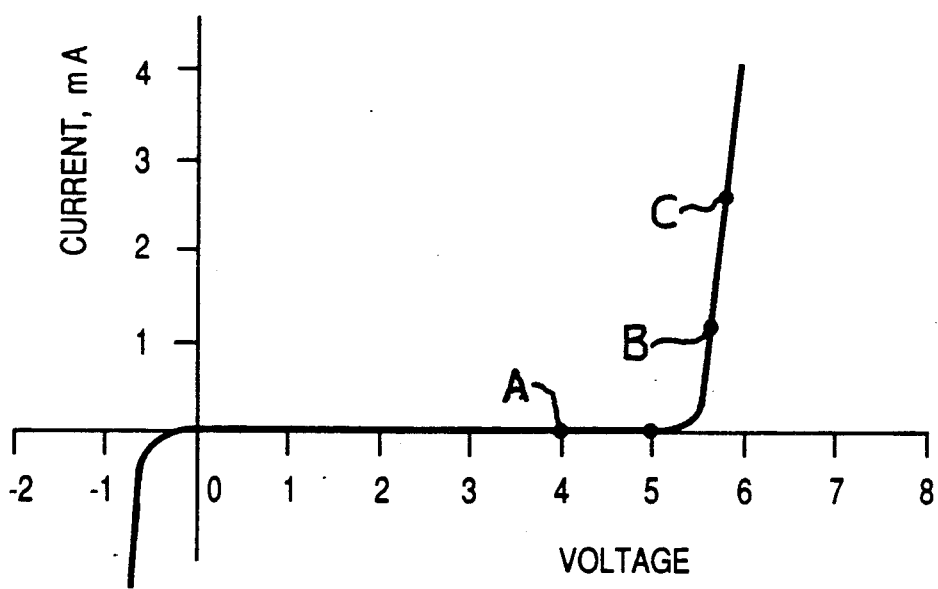
FIG. 2 is a current-voltage diagram illustrating certain bias conditions occurring during operation of the apparatus of FIG. 1.
Figure 3:
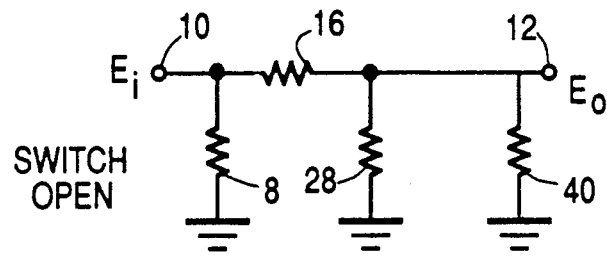
FIGS. 3 and 4 are AC equivalent circuits illustrating certain aspects of operation of the apparatus of FIG. 1.

It is a feature of the arrangement that the attenuation provided by attenuator 14 when diode 22 is conductive may be controlled by selection of the bias current I1 and may be determined with great precision by use of the AC equivalent circuit of FIG. 3 in combination with the Zener diode characteristic (conductance) curve of FIG. 2.

In more detail, according to principles of voltage division, the attenuation is equal to the impedance of the shunt branch divided by the sum of the impedances of the shunt and series branches. From the AC equivalent circuit of FIG. 3 it is apparent that the AC impedance of the series branch is simply the value of the series resistor 16 and the impedance of the shunt branch is equal to the parallel combination of bias resistor 28 and the on-resistance of Zener diode 22 (illustrated by a resistor 40). One may thus readily calculate the required diode resistance for a given desired value of attenuation and specific values of the resistors 16 and 28. An exact equation for the diode resistance is as follows:

$$R40 = K(R16)(R28)/\{(R28) - K(R16) - K(R28)\} \quad (1)$$

wherein:
R40 is the diode resistance to be determined
K is the attenuation factor expressed as a fraction, Eo/Ei.
R16 is the resistance of the series branch, and
R28 is the output resistance of current source 14 which, in this example is given by the value of resistor 28.

As a practical matter, the output impedance of the current source 14 (resistor 28) may typically be quite large as compared with the required on-resistance of diode 40. In such a case, the equation (1) above for diode resistance simplifies to the following:

$$R40 = K(R16)/(1 - K) \quad (2)$$

Once the desired diode resistance is determined the value of the bias current I1 may then be determined from the Zener diode characteristic curve of FIG. 2. This curve (not to scale) represents typical conductance characteristics for a low power (e.g., one-half Watt) Zener diode having a threshold of about 6.2 volts. Three operating points are shown. Point A represents the diode conductance below cut-off. This operating condition is discussed later. Points B and C represent the diode operating points when the diode is forward biased at currents of about 1.0 and 2.5 mA, respectfully. The slope of the diode curve at a given operating point represents the conductance of the diode. As is seen, an increase in diode current I1 results in increased diode conductance and thus a decrease in diode resistance.

The choice of a specific operating point (B or C) depends on two factors, namely, the desired attenuation and the maximum expected negative going excursions of the input signal. More specifically, the diode operating point (in terms of turn-on current) should be high enough that the diode on resistance satisfies the desired attenuation (equations 1 or 2 above) and that peak negative input signal excursions do not turn the diode off. For these reasons when switching relatively large signals (e.g., baseband video signals) it is preferred to bias diode 22 at a point "C" which is relatively remote from the knee of the diode curve rather than at point "B" which is relatively close the knee of the curve. Where the input signal to be switched is a small signal (e.g., and RF signal of a few hundred millivolts) operation may be much closer to the knee of the characteristic curve without danger of the input signal driving the diode to cut-off.

Another consideration for the choice of a specific diode operating point is the overall power dissipation. It will be noted that power is dissipated in resistor 28 and diode 22 when switch 30 is open and power is also dissipated in resistor 28 and resistor 32 when switch 30 is closed. For minimum power dissipation one would choose the lowest operating point for Zener diode 22 which would meet the dual objectives of (1) providing adequate attenuation and (2) providing a margin of safety to ensure that the maximum negative value of the expected input signal does not turn the Zener diode off during normal operation of the switching apparatus. A further consideration concerns switching speed. It is generally faster to divert current from the Zener diode and its associated parasitic capacitances to achieve turn-off if the current is of a lower value. To summarize, the operating point for the condition when Zener diode 22 is turned on depends on a number of factors including: required attenuation, the maximum negative value of the input signal to be switched, the overall power dissipation and switching speed. For baseband video switching of a nominal 1-V P-P (one volt peak to peak) video signal an operating point of about 2.7 milli-Amperes (point C in FIG. 2) has been found to be satisfactory for a typical 400 milli-Watt 5.6 Volt Zener diode.

Returning to FIG. 1, when switch 30 is CLOSED the load resistor 32 diverts the current I1 from Zener diode 22 thereby turning diode 22 off and an input signal S1 applied to terminal 10 is conducted to output terminal 12. In order to ensure that diode 22 is fully turned off one may select I1 and the value of load resistor 32 such that the product of the current I1 and the value of load resistor 32 is less than the break-down voltage of diode 22. This may be expressed mathmetically as:

$$(I1)(R32) < Vz \quad (3)$$

wherein:
I1 is the current provided current source 14;
R32 is the value of the load resistor 32;
and Vz is the threshold voltage of Zener diode 22.

Advantageously, if equation (3) is satisfied for the switch of FIG. 1, then it is ensured that all of the current I1 will be diverted to the load resistor 32. This follows because capacitor 18 blocks the flow of direct current in the series branch and diode 22, when off, is essentially an open circuit. Accordingly, the quiescent DC component of voltage produced at output terminal 12 for this condition is fully independent of the series branch impedance and is also independent of whatever DC component may be present in the input signal applied to input terminal 10.

In more detail, in a preferred application of the invention, the supply voltage Vs and the values of resistors 28 and 32 are selected such that the Zener diode is biased at a potential of about 4 volts when switch 30 is closed (point A in FIG. 2). At this voltage the Zener diode 22 is completely turned off yet the output voltage is positive with respect to ground and provides a DC quiescent level suitable for biasing the input stage of a DC coupled amplifier which may be coupled to output terminal 12. This is shown and described in detail later with regard to the discussion of FIG. 5 and provides the advantage of the possibility of completely eliminating the need for DC bias circuits for the following DC coupled amplifier. In other words, the bias circuitry for the diode switch serves a dual function of also providing proper DC bias for a following amplifier thereby providing an economy of parts and thus improved overall reliability of the switching and amplifying circuit.

Figure 4:
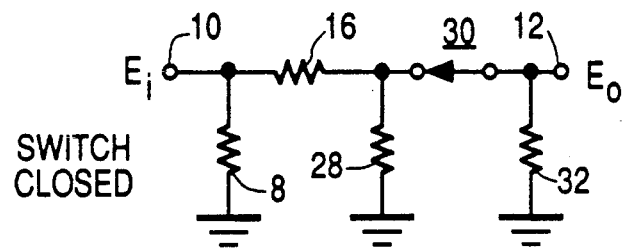

Consideration will now be given to the insertion loss of the switching apparatus of FIG. 1. FIG. 4 is an AC equivalent, circuit of the switching apparatus for the condition where switch 30 is closed. To simplify the analysis of the equivalent circuit it is assumed that the on-resistance of the switch 30 is negligible as compared to the value of the load resistor 32. With this assumption the attenuation of the overall switching circuit is equal to the resistance of the shunt branch (resistors 28 and 32 in parallel) divided by the sum of the resistances of the series branch (resistor 16) and the shunt branch. This may be expressed as:

$$A = (R28)(R32)/[(R16)(R28) - (R16)(R32) - (R28)(R32)] \quad (3)$$

wherein
A is the attenuation Eo/Ei,
R16 is the value of the series branch resistor,
R28 is the value of the output impedance of current source 14 (i.e., resistor 28) and
R32 is the value of the load resistor 32.

By selecting values for the load resistor 32 and the current source 14 impedance to be large with respect to the series branch impedance (resistor 16) the overall insertion loss of the switching apparatus can be made quite small. As a first example, an insertion loss of only about 1.2 dB is obtained using the following resistor values: R16=270 Ohms, R28=5600 Ohms and R32=2700 Ohms. As another example, an insertion loss of less than 3 dB is obtained when using the resistor values: R16=270 Ohms, R28=2200 Ohms and R32=1000 Ohms. This latter set of resistor values has been used in implementing a presently preferred embodiment of the invention shown in FIG. 5.

FIG. 5 presents further features of the invention for providing switching between multiple sources and for providing amplification of the switched signals. In this embodiment of the invention the circuitry is simplified in that only a single load resistor is needed for all the sources and the feature of providing a predetermined output voltage is used to advantage in providing DC bias for an output direct coupled amplifier. The amplifier completely overcomes the insertion loss of the switch and provides additional gain as well. The advantages which flow from the basic configuration of FIG. 1 are thus enhanced by improved reliability for switching multiple input signals due to a reduction in the number of load resistors required and a reduction in the number of parts which otherwise would be required to establish DC bias for the amplifier.

In detail, the example of FIG. 5 is designed for selecting one of four input signals for processing by a television apparatus such as a recorder, a receiver, a monitor, a special effects device or the like. The four input terminals 500-506 are each terminated by terminating resistors 508-514. For this specific application, video switching, the terminating resistors are selected to be slightly higher than the characteristic impedance of the signal sources, an exemplary value being 82 Ohms for a source impedance of 75 Ohms. The reason for choosing a slightly higher terminating resistance than the source impedance is that when the switch is turned on an additional load is presented to the input signal terminal. This additional load is effectively in parallel with the input resistor and thus reduces the effective termination impedance to the characteristic impedance of the signal source coupled to terminals 500-506.

Attenuators 516-522 are coupled to inputs 500-506 and are of the same construction as the attenuator 14 of FIG. 1. Exemplary element values for the attenuators are as follows:
Series resistor: 270 Ohms
Series capacitor: 47 micro-Farads
Shunt Zener: 5.6 Volts, ½ Watt.

Turn-on bias for each of the attenuators is provided by a supply voltage terminal 530 which is coupled to the output nodes 532-538 of attenuators 516-522 by respective resistors 540-546. An exemplary value for each of these resistors is 2200 Ohms.

The outputs 532-538 of attenuators 516-522 are connected to respective inputs 552-558 of a four-input single throw switch 550. This switch (outlined in phantom) includes four individual switches (A, B, C and D) controlled by a decoder 560 such that one of the four switches is closed in response to a two-bit binary control signal applied to the switch decoder inputs 562 and 564. The outputs of the four switches A-D are connected in common and to an output terminal 556. An integrated circuit analog multiplex switch having these features is the type CD-4052 which is available from various manufacturers. See, for example, the DATA BOOK entitled "RCA COS/MOS Intergrated Circuits" published by RCA Corporation in 1980 and incorporated herein by reference. The data book includes other switch configurations (e.g., SPSP, DPDT and TPDT) suitable for practising the invention. Other suitable switches are available from other manufacturers in CMOS technology and in other integrated circuit technologies (e.g., NMOS, PMOS and bipolar).

Advantageously, only a single load resistor 560 need be connected to the switch 550 output terminal 556. Since all the component values of the termination, attenuation and current sources are the same, the DC output voltage at terminal 556 will be the same for any one of the four input signals that is selected, namely, 4 volts for the specific values noted above.

The output 556 of switch 550 is directly connected to the input 572 of a DC amplifier 570 having a supply voltage input terminal 574 connected to supply terminal 530 and having an output terminal 576 for providing an amplified output signal. Amplifier 570 includes an NPN input transistor 578 biased by a potential divider comprising resistors 580 and 582 connected in series in the order named between a supply terminal 572 and ground. The collector of transistor 578 is coupled to the base of an output transistor 586 and to the supply terminal 574 via a load resistor 584. The output transistor 586 is connected at the emitter thereof to supply terminal 574 via an emitter load resistor 590 and is connected at the collector thereof to output terminal 576 and via a load resistor 592 to ground.

Exemplary values for the elements of amplifier 570 for providing a gain of about 6 dB are as follows:
Resistor 580: 10 KOhms
Resistor 584: 1.5 KOhms
Resistor 592: 2 KOhms
Resistor 582: 1K KOhms
Resistor 590: 1 KOhms
Supply: 12 Volts Advantageously, it will be noted that no internal DC biasing provisions are needed for amplifier 570. This feature of the invention results because the proper DC bias for this amplifier is provided by the current source resistors 540-546 and the load resistor 560 of the switching circuit. As previously explained these elements provide a DC output voltage of about 4 volts for the exemplary element values given. Since decoder 560 turns on only one switch at a time the DC output of the switch 550 is the same regardless of which of the input signals is selected. The elimination of a separate DC bias circuit for amplifier 570 both reduces the amplifier cost and improves its reability since there are fewer parts required to implement the amplifier and thus fewer parts are subject to failure than otherwise would be the case.

It will be further noted in the embodiment of FIG. 5 that the amplifier supply terminal 574 and the current sources (540-546) for the attenuators 516-522 are connected to a common supply voltage terminal 530. By this feature of the invention the DC bias for the amplifier 570 provided by the attenuators and the load resistor is made to "track", so to speak, variations in the supply voltage applied to terminal 530. Stated another way, variations in the overall supply voltage are compensated for since a decrease in supply voltage will decrease both the DC output voltage across load 560 and the DC operating potential for amplifier 570 and vice versa. This tends to maintain amplifier 570 in a linear operating range notwithstanding variations in the supply voltage, Vs.

Figure 6:
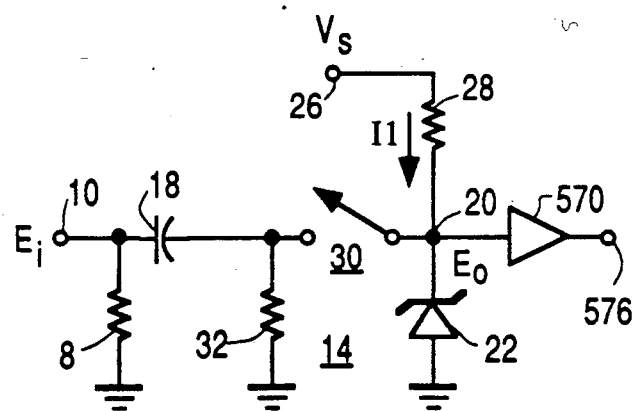
FIG. 6 illustrates a modification of the embodiment of FIG. 1 in which, inter alia, the switch positions in the cascade connection are reversed.

In FIG. 6 the positions of the switches are reversed, that is, the attenuator 14 is placed after switch 30 in the cascade connection rather than preceeding the switch 30. In this embodiment the resistor 16 has been omitted. As will be explained, the function formerly provided by resistor 16 of providing a series impedance for the series branch of attenuator 14 is provided instead by switch 30 which, in the open condition, respresents a very high impedance comprising, mainly, capacitive reactance due to parasitic coupling capacities associated with the switch elements. Since the impedance of switch 30 when open is very high compared with the "ON" resistance of diode 22, the attenuation is very high also.

In more detail, in FIG. 6 the signal input terminal 10 is coupled to ground via an input terminating resistor 8 (which is optional, as previously explained) and is coupled via a DC blocking capacitor 18 to the input of switch 30. The load resistor 32, previously connected at the output of switch 30 is now connected between the input of switch 30 and ground. The attenuator 14 output node 20 is coupled via resistor 28 to a supply terminal 26 for receiving the supply voltage Vs and is coupled to the cathode of Zener diode 22 the anode of which is grounded. A DC coupled amplifier, such as amplifier 570 of FIG. 5, is connected at its input to the attenuator output node 20 and connected at its output to output terminal 576.

The general operation of this example is much the same as in the previous example of FIG. 1 and so will be discussed only briefly here. When switch 30 is open, the current I1 flowing through resistor 28 turns-on Zener diode 22 thereby providing a low impedance between the attenuator 14 output and ground. This corresponds to the bias condition shown as points "A" or "B" in FIG. 2. Since switch 30 is open and the input impedance of amplifier 570 is very large compared with the impedance of diode 22, essentially all of the I1 current flows through diode 22 to ground. The attenuation for this condition is given approximately by the equation:

$$A = Zs/(Zd + Zs) \qquad (4)$$

wherein:
A is the attenuation, Eo/Ei;
Zs is the impedance of the series branch with switch 30 open; and
Zd is the impedance of Zener diode 22 for the value of bias current I1 selected.

When switch 30 is closed the current I1 is diverted through switch 30 and load resistor 32 to ground thereby turning Zener diode 22 off. Capacitor 18 prevents diversion of the current I1 to the input terminal 10 or to the input termination resistor 8. As in the previous discussion, the values of the supply voltage Vs and resistors 28 and 32 are selected to bias Zener diode 22 at a predetermined voltage when switch 30 is closed to thereby provide DC bias for the input of the amplifier 570. Resistor 16 is not needed in this example because the impedance of switch 30 when open is quite high.

The benefits of over-voltage protection are retained in this example of the invention to the extent that Zener diode 22 limits positive transients and negative transients appearing at the output of switch 30 and thus protects the subsequent circuitry (e.g., amplifier 570) from such transients.

The example of FIG. 6 does not readily lend itself to applications requiring multiple pole switching. For such applications the example of FIG. 1 is preferred since several switches may be combined by connecting their outputs together as shown in FIG. 5.

There has been shown and described herein examples of switching apparatus in which switches are cascaded for improved off-state attenuation. In the embodiments shown, one switch of the cascade connection comprises an L-type attenuator with a series branch including an impedance and a shunt branch including a Zener diode. In the examples of FIGS. 1 and 5 the impedance of the series branch is provided by a resistor whereas in the example of FIG. 6 the impedance of the series branch is provided by the other switch of the cascade connection. A bias network, coupled to the attenuator and to the other switch of the cascade connection controls the diode bias for operation at a specific current conduction level when the other switch of the cascade connection is open and at a specific reverse bias voltage condition when the second switch is closed whereby the apparatus provides plural functions, such as: (1) enhancing the switch off-state attenuation, (2) providing over-voltage and over-current protection for input transients of either polarity and (3) providing a predetermined output DC level when the second switch is closed for establishing the DC bias of a subsequent circuit, such as an amplifier, the DC bias being so supplied being in a tracking relationship with the DC power supplied to the subsequent circuit.

What is claimed is:

1. Switching apparatus comprising:
an L-type attenuator and a switch connected in cascade between a signal input terminal and a signal output terminal;
said L-type attenuator having a series branch including an impedance and having a shunt branch including a Zener diode; and
a bias network coupled to said attenuator for controlling the conductance of said Zener diode;
said bias network being responsive to an open condition of said switch for biasing said Zener diode to conduct a predetermined operating current, said bias network being responsive to a closed condition of said switch for biasing said Zener diode at a predetermined quiescent bias voltage level; and wherein:
said Zener diode is directly connected without intervening elements between an output of said attenuator and a point of fixed reference potential.

2. Switching apparatus as recited in claim 1 wherein said series branch comprises a series connection of a capacitor and a resistor.

3. Switching apparatus as recited in claim 1 further comprising:
an amplifier DC coupled to said signal output terminal for receiving quiescent DC bias from said signal output terminal; and
a source of supply voltage coupled to a supply voltage input terminal of said bias network and coupled also to a supply voltage input terminal of said amplifier.

4. Switching apparatus as recited in claim 1 wherein:
said bias network comprises a current source coupled to said output of said attenuator and a load resistor coupled between an output termianl of said switch and a source of reference potential.

5. Switching apparatus as recited in claim 3 wherein:
said current source provides a current of a value I; and said load resistor is a value R such that the product of the values IR equals said predetermined quiescent bias voltage level.

6. Switching apparatus as recited in claim 1 wherein said bias network comprises:
a resistor coupled between a source of supply voltage and said output of said attenuator; and
a further resistor coupled between an output terminal of said switch a signal ground point.

7. Switching apparatus as recited in claim 1 wherein:
said bias network includes a current source coupled to supply a current I1 to said output of said attenuator and includes a load resistor having a value R1 Ohms coupled between a selected terminal of said second switch and a ground reference potential point; and
the product of the current I1 and the load resistance R 1 is selected to be less than Vz wherein Vz is the Zener breakdown voltage of said Zener diode.

8. Switching apparatus, comprising:
an L-type attenuator and a switch connected in cascade between a signal input terminal and a signal output terminal; and a bias network coupled to said attenuator and said switch for controlling said attenuator in accordance with the conductive state of said switch;
and wherein:
said attenuator having a series branch including a first resistor and a capacitor coupled between said signal input terminal and an input of said switch and having a shunt branch consisting of a Zener diode coupled without intervening elements between said input of said switch and a source of reference potential; and said bias network comprises a current source coupled to said Zener diode for supplying a predetermined turn-on current thereto when said second switch is in an open condition, said bias network including a load resistor coupled to an output of said second switch for diverting said predetermined current from said Zener diode when said second switch is in a closed condition.

9. Switching apparatus as recited in claim 8 further comprising:
an amplifier D.C. coupled to said signal output terminal; and wherein:
said current source and said load resistor are selected to provide a predetermined DC component of output voltage at said output terminal when said switch is in said closed condition for establishing a given quiescent DC operating point for said amplifier.

10. Switching apparatus as recited in claim 8 further comprising:
an amplifier DC coupled to said signal output terminal;
a source of supply voltage coupled to a supply input terminal of said amplifier and coupled to a supply input terminal of said current source such that said current source and said load resistor produce a DC component of output voltage when said switch is closed for biasing said amplifier.

11. Switching apparatus as recited in claim 8 wherein:
said predetermined turn-on current provided by said current source is selected to provide a predetermined impedance for said Zener diode when said switch is in said open condition, said predetermined impedance being substantially less than the impedance of said first resistor of said shunt branch.

12. Switching apparatus, comprising:
an input terminal, a supply terminal, a circuit node and an output terminal;
a first resistor and a capacitor coupled in series between said input terminal and said circuit node;
a second resistor coupled between said circuit node and said supply terminal;
a Zener diode having a cathode connected to said circuit node and having an anode connected to a point of reference potential;
a switch connected between said circuit node and said output terminal; and
a third resistor connected between said output terminal and said point of reference potential.

13. Switching apparatus as recited in claim 12 further comprising:
an amplifier having a signal input DC coupled to said output terminal and having a power input terminal connected to said supply voltage terminal.

14. Switching apparatus, comprising:
a single-pole N-position switch having N switch input terminals and a single output terminal;
a number, N, of signal input terminals;
a resistor and a capacitor connected in series between corresponding ones of each of said N signal input terminals and respective ones of each of said N switch input terminals;
a supply voltage terminal;
a separate resistor connected between said supply voltage terminal and respective ones of each of said N switch input terminals;
a number N of Zener diodes, each having an anode connected to a point of reference potential and having a cathode connected to a respective one of said N switch input terminals; and
a load resistor connected between said switch output terminal and said point of reference potential.

15. Switching apparatus as recited in claim 14 further comprising and amplifier having a power input terminal connected to said supply voltage terminal and having a signal input terminal connected to said signal output terminal of said single pole N-position switch.

* * * * *